United States Patent
Yu et al.

(10) Patent No.: US 9,305,840 B2
(45) Date of Patent: Apr. 5, 2016

(54) CLUSTER SYSTEM FOR ELIMINATING BARRIER OVERHANG

(71) Applicant: Macronix International Co., Ltd., Hsinchu (TW)

(72) Inventors: Hsu-Sheng Yu, Hsinchu County (TW); Hong-Ji Lee, Taoyuan County (TW); N. T. Lian, Hsinchu (TW); T. H. Yang, Hsinchu (TW)

(73) Assignee: MACRONIX INTERNATIONAL Co., LTD., Hsinchu (TW)

( * ) Notice: Subject to any disclaimer, the term of this patent is extended or adjusted under 35 U.S.C. 154(b) by 0 days.

(21) Appl. No.: 14/138,038

(22) Filed: Dec. 21, 2013

(65) Prior Publication Data

US 2015/0179514 A1    Jun. 25, 2015

(51) Int. Cl.
*H01L 21/768* (2006.01)
*H01L 23/522* (2006.01)
*H01L 23/532* (2006.01)
*H01L 21/67* (2006.01)

(52) U.S. Cl.
CPC .... *H01L 21/76879* (2013.01); *H01L 21/67207* (2013.01); *H01L 21/76843* (2013.01); *H01L 23/5226* (2013.01); *H01L 23/53266* (2013.01); *H01L 2924/0002* (2013.01)

(58) Field of Classification Search
CPC .............................................. H01L 21/76843
See application file for complete search history.

(56) References Cited

U.S. PATENT DOCUMENTS

| | | | |
|---|---|---|---|
| 2002/0176032 A1* | 11/2002 | Maeda et al. | 349/43 |
| 2004/0127014 A1* | 7/2004 | Huang et al. | 438/627 |
| 2007/0111519 A1* | 5/2007 | Lubomirsky et al. | 438/678 |
| 2007/0242263 A1* | 10/2007 | Huang et al. | 356/128 |
| 2007/0254466 A1* | 11/2007 | Nam | 438/597 |
| 2008/0311711 A1* | 12/2008 | Hampp et al. | 438/197 |
| 2010/0193687 A1* | 8/2010 | Fujieda et al. | 250/310 |
| 2012/0077349 A1* | 3/2012 | Li | C23C 16/45542 438/762 |

* cited by examiner

*Primary Examiner* — Thao X Le
*Assistant Examiner* — Xia L Cross
(74) *Attorney, Agent, or Firm* — Stout, Uxa & Buyan, LLP; Frank J. Uxa

(57) ABSTRACT

A cluster tool is disclosed that can increase throughput of a wafer fabrication process by facilitating removal of barrier overhang in contact holes of contact film stacks. Individual chambers of the cluster tool provide for deposition of barrier material onto a semiconductor structure, depositing over with an amorphous carbon film (ACF), etching back the ACF, and etching a corner region of the contact hole. Removal of the barrier overhang improves the quality of metal fill-in of the contact hole. An expectedly ensuing feature entails a technique in which filling-in of the contact hole with a metal such as tungsten can be achieved with attenuated or eliminated adverse consequence.

20 Claims, 4 Drawing Sheets

CLUSTER SYSTEM FOR ELIMINATING BARRIER OVERHANG

BACKGROUND OF THE INVENTION

1. Field of the Invention

The present invention relates generally to semiconductor fabrication methods and, more particularly, to a system for fabricating contact holes.

2. Description of Related Art

Integrated circuit devices typically are composed of layers of semiconductor and insulating material modified using known manufacturing methods to form active and other microstructures such as gates, drains, sources and the like. These microstructures then are interconnected with conducting material in order to provide the desired functionalities of a given integrated circuit. The interconnecting may be achieved using contact holes filled with a highly conductive metal. Known manufacturing methods have been devised to achieve the required interconnections.

Conducting metal in a contact hole must be isolated from the surrounding integrated circuit material. Failure to isolate properly the conducting metal from those surrounding materials may result in intermixing of the conducting metal and the other materials or their functionalities due to, for example, diffusion in one direction and/or the other. These undesired diffusion processes tend to degrade performance of the integrated circuit and to result in lower yields. In order to provide proper isolation between the different classes of material, a thin layer of barrier material is often disposed between the conducting metal and the surrounding material, e.g., by way of lining the contact hole with barrier material as a step in the fabrication process.

Creating a conducting path through a contact hole in the integrated circuit material can involve at least two steps, one being to deposit a thin film of barrier material that lines the contact hole and the other being to fill the lined contact hole with conducting material.

As contact hole sizes become smaller, slight variations in the process of depositing the film of barrier material can become more important. For example, an overhang profile may result that may partially occlude an opening to a contact hole, thereby impeding metal fill-in of the contact hole and producing imperfections such as voids and/or seams in the conducting metal fill-in. These imperfections can degrade reliability, reduce yields, and increase manufacturing costs of the integrated circuits.

A need thus exists in the prior art for a method of eliminating barrier material overhang that can result in incomplete fill-in of contact holes in an integrated circuit. A further need exists for apparatus to implement the method in fashions which are reliable yet rapid.

SUMMARY OF THE INVENTION

The present invention addresses these needs by providing a cluster tool for metal fill-in of contact holes in integrated circuits. The cluster tool herein disclosed comprises, according to one embodiment, a first chamber for depositing barrier material. The first chamber may comprise a radio-frequency physical vapor deposition (RF PVD) chamber that, further, may be adapted to deposit metal for a damascene metal gate. According to another embodiment, the first chamber comprises a chemical vapor deposition (CVD) chamber. The first chamber, in typical embodiments, is made to deposit one or more of titanium, titanium nitride, and aluminum. The cluster tool further comprises, according to the embodiments, a second chamber for fill-in of (e.g., via deposition) an amorphous carbon film (ACF), and a third chamber for performing etchback of the ACF and barrier-material corner etch.

One aspect of the invention can comprise a method for ultra metal fill-in of a contact hole, an implementation of which may include etching to form a contact hole followed by depositing a barrier material within the contact hole. The barrier material is deposited to form a thin layer covering surfaces of the contact hole, whereby the depositing may undesirably result in formation of an overhang that partially occludes an opening of the contact hole. The implementation continues by coating, e.g., depositing over the contact hole with an ACF, etching back the ACF to expose the overhang (e.g., the barrier overhang), and etching to remove the barrier overhang. The ACF then may be stripped. The depositing may comprise depositing titanium, titanium nitride, or aluminum. Elimination of the barrier overhang may facilitate fill-in of the contact hole with conducting metal, thereby increasing reliability and yield of integrated circuit wafer fabrication processes.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE PRESENTLY PREFERRED EMBODIMENTS

Figure 1A:
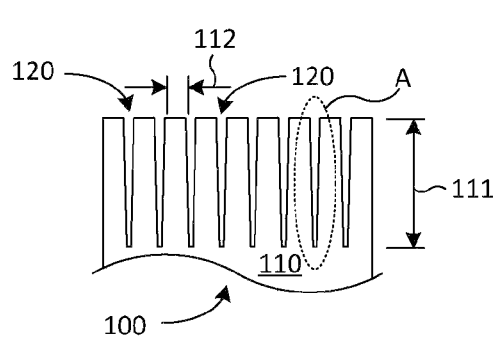
FIG. 1A is an illustration of a portion of a conventional integrated circuit structure that includes contact holes formed in an oxide layer.

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a cluster tool for metal fill-in and a related method of manufacture.

Referring more particularly to the drawings, FIG. 1A is an illustration of a portion of a prior art integrated circuit structure 100 that includes undulations in the form of a plurality of contact holes 120 formed in an oxide layer 110 of an integrated circuit. A depth 111 of the contact holes 120 may range from about 400 nm to about 800 nm with a typical value being about 600 nm. The contact holes 120 may be separated by a distance 112 that may range from about 20 nm to about 40 nm with a preferred separation of about 30 nm. Each of the contact holes 120 may have a transverse diameter ranging from about 40 nm to about 60 nm, diameters normally being about 50 nm. The contact holes 120 may be fabricated using known methods including, as an example, patterning an upper surface of integrated circuit material, e.g., the oxide layer 110, and etching with fluorine base chemistry.

Figure 1B:
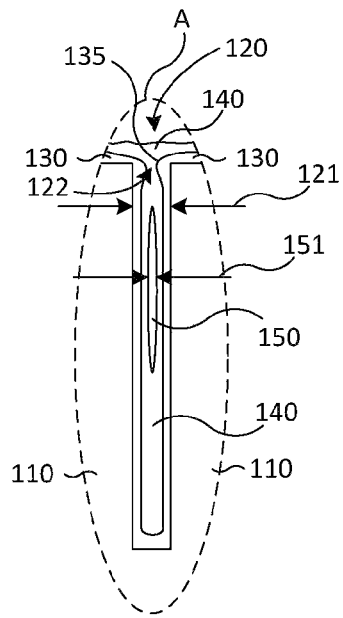
FIG. 1B illustrates a conventional, incomplete fill-in of one of the contact holes of FIG. 1A with conducting metal.

FIG. 1B is a magnified view of a region A outlined with phantom lines in FIG. 1A of a typical contact hole 120 in the prior art integrated circuit structure 100. (Note: The contact hole 120 illustrated in FIG. 1B and subsequent figures is shown as having a rectangular cross-section, although the true shape of the contact hole 120 may or may not include a taper or other desired cross-section as suggested in FIG. 1A.) A barrier layer 130 may be deposited over the integrated circuit structure of FIG. 1A, which barrier layer 130 tends to line the contact holes 120, as illustrated in FIG. 1B. Subsequent to deposition of the barrier layer 130, a layer of conducting metal, e.g., tungsten, 140 may be deposited with the consequence of filling the contact hole 120. Methods of the prior art may introduce a barrier overhang 135 that may undesirably constrict or partially occlude the opening to the contact hole 120 as illustrated in FIG. 1B. The barrier overhang 135 reduces the available cross-section 122 of the contact hole 120 from a desired width that may range from about 10 nm to about 30 nm to a problematic width of about 20 nm. When the contact hole 120 is filled with conducting metal (e.g., tungsten) 140, an imperfection such as a seam, a gap or, in the present example, a void 150 may form in the tungsten. The illustrated void 150 may have a width 151 that can vary from about 20 nm to about 40 nm, which may adversely affect a value of conductance of a contact formed through the contact hole 120, thereby degrading the performance of the integrated circuit.

Figure 2A:
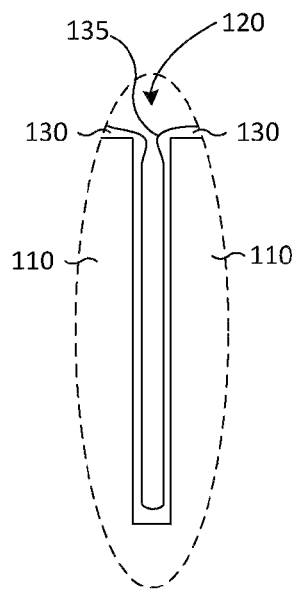
FIG. 2A is a depiction of a contact hole arrangement according to processing of the invention, in which deposition of a layer of barrier material has resulted in a barrier overhang.

FIG. 2A shows a contact hole 120 formed through one or more layers of an integrated circuit structure, which may be similar to that illustrated in FIG. 1A, at an intermediate stage of a sequence of processing steps. The one or more layers may comprise, for example, a multi-layer film stack formed over a substrate. Although the substrate preferably comprises a silicon substrate, in alternative embodiments the substrate can comprise materials such as gallium nitride (GaN), gallium arsenide (GaAs), or other materials commonly recognized as suitable semiconductor materials to those skilled in the art. The one or more layers in this example are represented by a dielectric (e.g., an oxide) layer 110.

Dimensions of the contact hole 120 may be similar to those as would occur in the above with reference to FIGS. 1A and 1B. For instance, a depth 111 of the contact holes 120 may range from about 400 nm to about 800 nm with a typical value being about 600 nm. The contact holes 120 may be separated by a distance 112 that may range from about 20 nm to about 40 nm with a preferred separation being about 30 nm. Each contact hole may have a transverse diameter ranging from about 40 nm to about 60 nm, with diameters normally being about 50 nm. The contact hole(s) 120 may be fabricated using known methods including, as an example, patterning an upper surface of integrated circuit material, e.g., the oxide layer 110, and etching with fluorine base chemistry.

The contact hole 120 of FIG. 2A has been overlaid with a thin film/layer of barrier material 130 such as titanium nitride (TiN) or Ti. In the illustrated embodiment, TiN may be selected for deposition as the barrier material, it being a hard, dense, refractory material which can provide benefits such as high electrical conductivity. In modified embodiments, the barrier layer 130 may comprise other compositions (e.g., composites/materials with similar properties) which may be recognized by those skilled in the art in view of this disclosure as suitable, a few being, without limitation, one or more of tantalum nitride (TaN), wolfram nitride (WN), molybdenum nitride (MoN), and Ti/TiN, deposited by, for instance, chemical vapor deposition (CVD). The term Ti/TiN may refer to either a titanium layer which has been annealed in a nitrogen atmosphere to at least partially convert the titanium to TiN, or a thin titanium layer on which is deposited a thin TiN layer by a separate process step. According to certain aspects of the invention, the barrier layer 130 can be formed using known techniques to thicknesses ranging, typically, from about 5 nm to about 30 nm, with an exemplary dimension being about 20 nm.

As shown in the diagram, a barrier overhang 135 in the barrier layer 130 may distort or partially occlude the opening to the contact hole 120. This occlusion may prevent complete fill-in of a conducting metal (e.g., tungsten) as described above in relation to FIG. 1B. According to a feature of the present invention, structure and steps are utilized to attenuate adverse consequences which may result from the barrier overhang 135, whereby there may be facilitated a more complete fill-in of the contact hole 120 with the tungsten.

Pursuant to this feature of enabling better fill in, the contact hole 120 shown in FIG. 2A may, as a next processing step, be filled with another material such as a dielectric. In implementations such as that illustrated in FIG. 2B, the dielectric may take the form of a layer 160 formed, for example, of amorphous carbon film (ACF). The ACF 160 may substantially fill the contact hole 120 and may (in exemplary embodiments) overlay top surfaces of the dielectric layer 110.

Figure 2B:
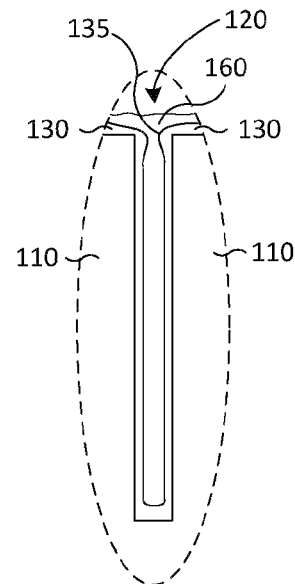
FIG. 2B shows the contact hole of FIG. 2A following coating with a layer of amorphous carbon film (ACF)
Figure 2C:
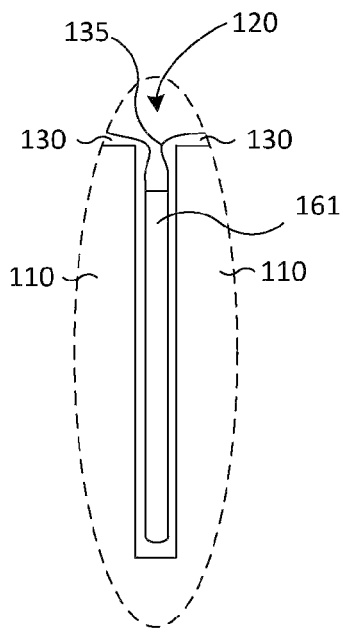
FIG. 2C illustrates an effect of etching back to remove a portion of the ACF, thereby exposing the barrier overhang.

Succeeding processing steps may include an etchback that removes an upper portion of the ACF 160 as illustrated in FIG. 2C. A lower portion 161 of the ACF may remain after this step to protect the bottom of the contact hole 120. Etchants employed to remove the upper portion of ACF 160 may comprise, as examples, $O_2$ or $H_2/N_2$. According to one instance of the etchback, the structure of FIG. 2B may be bombarded with particles, e.g., argon, to remove a surface/upper portion of the ACF 160 as illustrated in FIG. 2C. The etchback, and/or another step thereof, may in certain implementations, remove ACF 160 so as to expose the barrier overhang 135 and/or may reduce a surface thickness of exposed parts of the barrier layer so that the thickness of the barrier layer 170 in FIG. 2D may (in certain implementations) be less than the corresponding thickness thereof in FIG. 2B and/or FIG. 2C. A lower portion 161/162 of the ACF layer may be retained after the etchback, the retained portion acting to protect a bottom of the contact hole 120 during ensuing processing.

Figure 2D:
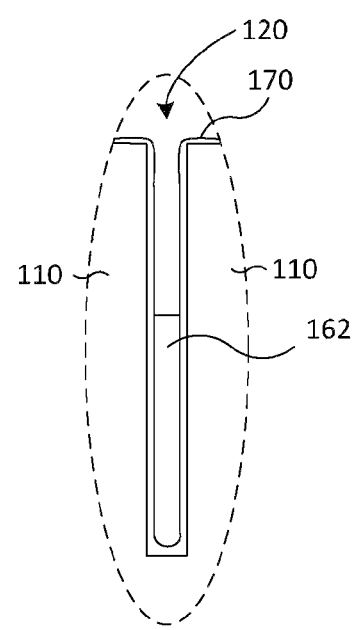
FIG. 2D portrays an effect of etching to reduce or remove the barrier overhang.

Subsequent to the etchback, an etch step using etchants such as $Cl_2$ or $BCl_3$ may be performed to remove the barrier overhang 135, a residual amount 162 of the ACF continuing to be present to protect the bottom of the contact hole 120 as illustrated in FIG. 2D. The remaining ACF 162 may be removed by a dry or wet strip process such as, respectively, via $O_2$ ash or backend solvent for metal clean, a result of the strip process being illustrated in FIG. 3, thereby preparing the contact hole 120 for deposition of tungsten.

Figure 4:
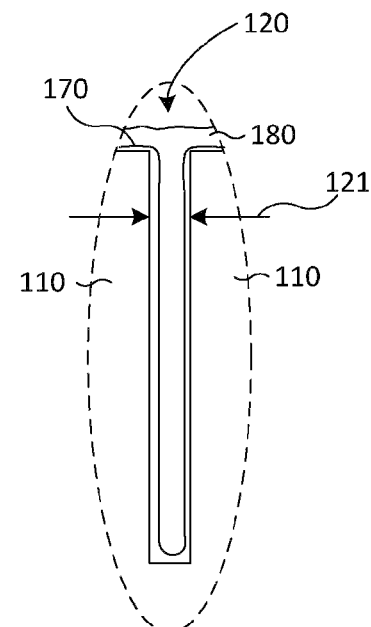
FIG. 4 illustrates an improved fill-in of the contact hole with a conducting material such as metal in accordance with the present invention.
Figure 7:
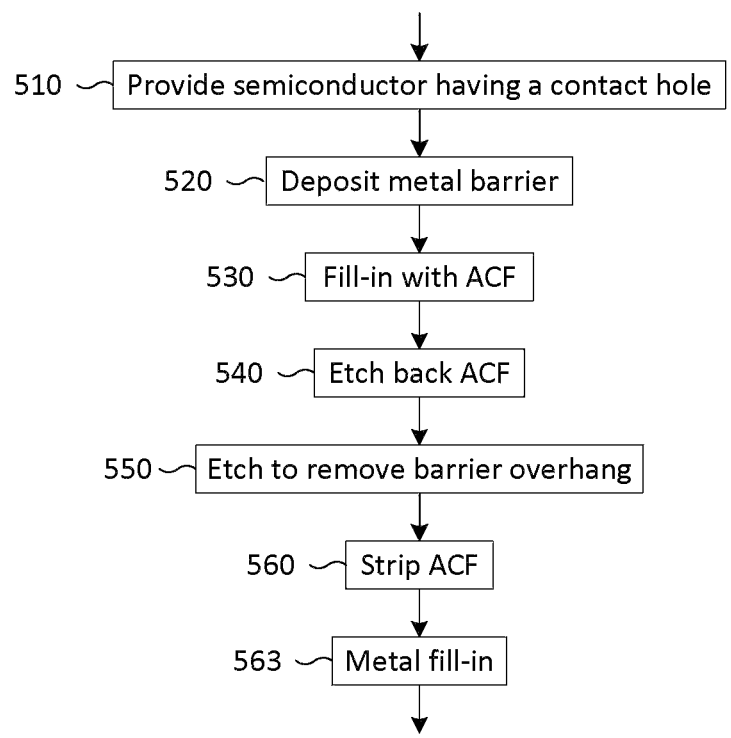
FIG. 7 is a flow diagram reflecting steps for implementation of methods according to the present invention.

The contact hole 120 may then be filled with a highly conducting metal, examples of which may include aluminum, tungsten, copper, and/or an alloy of a combination of the aforesaid and other trace elements. A typical implementation can comprise the deposition of tungsten 180 as illustrated in FIG. 4. In cases where the tungsten may exhibit a tendency to peel back, the barrier layer 130 may assist as an adhesive layer for preventing peeling or loosening of the tungsten. The barrier layer 130 as applied over the sidewalls and bottom of the contact hole 120 hence can assure adhesion of the tungsten, and, further, may aid in preventing spiking and/or electromigration. Importantly, in accordance with a key advantage of the discovered technique described herein, the fill-in (e.g., with tungsten) is substantially uniform and free of voids, seams, gaps or other defects FIG. 7 is a flow diagram describing an implementation of a method of the present invention. According to the illustrated activity, a semiconductor structure having at least one contact hole is provided at step 510. FIG. 1A illustrates a collection of such contact holes 120. A barrier material layer, which may be formed for example as above, is deposited at step 520. The result of this depositing may appear as depicted in the cross-section of a contact hole 120 illustrated in FIG. 2A, which depicts a barrier layer 130 lining the contact hole 120 while undesirably exhibiting a barrier overhang 135. At step 530, and with reference to FIG. 2B, an ACF is deposited over the contact hole 120.

At step 540 an etchback of the ACF 160 is performed. This etchback, which may employ etchants as mentioned above, may remove, for instance, an upper portion of the ACF 160 (FIG. 2B). A mechanism of the etchback according to featured implementations of the invention is the exposing of the barrier overhang at top corners of the contact hole 120, as illustrated in FIG. 2C. A lower portion 161 of the ACF may remain to protect the bottom of the contact hole 120.

Subsequently, at step 550, an etch is performed using, e.g., etchants as noted above, to attenuate and/or remove (e.g., eliminate) operationally-compromising parts of the barrier layer 130, such as the barrier overhang 135, whereby removal of the portions of the barrier layer 130 may leave a thinner barrier layer 170 on a surface of the structure as depicted in FIG. 2D. That is, the thickness of the barrier layer 170 may be less than the thickness of the barrier layer 130 shown in FIG. 2C. (The thickness may be measured in a direction perpendicular to a surface of the integrated circuit structure 100.) For example, the etch at step 550 may result in a thickness of the barrier layer 170 ranging from about 0 nm to about 20 nm with a typical value being about 10 nm, whereas in comparison the thickness of the barrier layer 130 may range from about 5 nm to about 30 nm, normally about 20 nm. An additional amount of the lower portion 161 of the ACF (FIG. 2C) may be removed at step 550 leaving a reduced ACF portion 162 that continues to protect the bottom of the contact hole 120.

Figure 3:
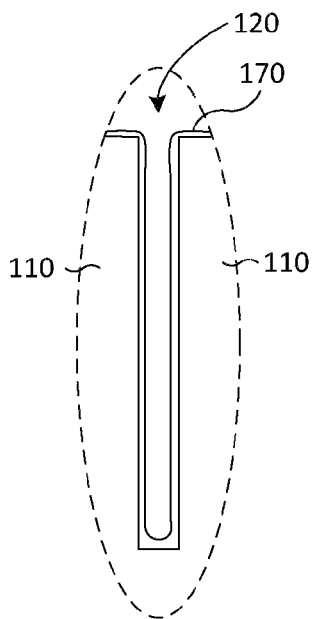
FIG. 3 depicts a result of stripping the ACF.

The reduced ACF portion 162 may be stripped at step 560 using a dry/wet process, thereby leaving the contact hole 120 with a substantially reduced barrier overhang or, preferably, with no barrier overhang, as illustrated in FIG. 3 and, as shown in FIG. 4, suitable for fill-in with tungsten 180.

In accordance with the preceding, subsequent metal fill-in of the contact hole, cf. 563, can be associated with (e.g., enabled with) a reduced incidence and degree of defect as a consequence of the barrier overhang removal. That is, the expectedly ensuing step 563 according to the invention, entailing a technique in which filling-in of the contact hole with a metal such as tungsten is facilitated, can be achieved with attenuated or eliminated adverse consequence. In instances where the thickness of the barrier layer 170 is zero after the etch at step 550, a second barrier layer may be deposited in order to avoid poor adhesion during metal fill-in at step 563.

Figure 5:
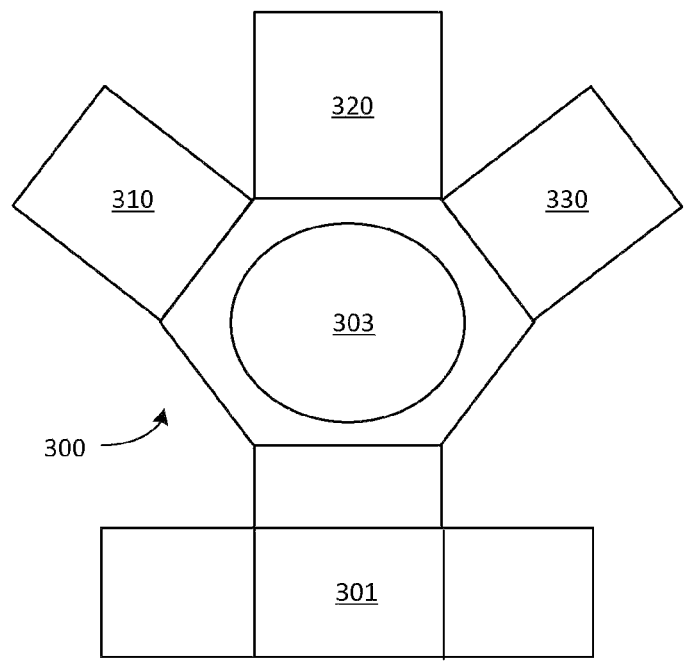
FIG. 5 is a diagram of an embodiment of a cluster tool adapted to implement methods of the present invention.

A further aspect of the invention may include a single cluster tool adapted to implement the method outlined above with reference to FIG. 7. Cluster tools, which may be employed to increase throughput of a wafer fabrication process, are known components of manufacturing facilities. According to one embodiment of the present invention, a cluster tool 300, as illustrated schematically in FIG. 5, comprises three or more integrated chambers, each being collocated with a single, shared main platform and each being adapted to perform particular steps of implementations of methods of the invention as set forth herein For example, with reference to FIG. 2A, a load/lock chamber 301 is adapted to receive a wafer to be processed according to the present invention, and a transfer module 303 may facilitate transfer of the wafer to a plurality of (e.g., three) chambers, wherein processing may be sequentially performed. In the illustrated embodiment, a first chamber 310 of the cluster tool 300 is adapted to perform deposition of a barrier layer 130, the barrier material comprising Ti, TiN, or Al, as examples. This deposition may correspond, for example, to the deposition performed at step 520 of the implementation described in FIG. 7. Examples of deposition processes which may deposit the barrier material include radio-frequency physical vapor deposition (RF PVD) or the above-mentioned CVD. It should be noted that the RF PVD chamber also may be used or usable to deposit metal in a process of forming a damascene metal gate.

A second chamber 320 of the cluster tool 300 is configured to deposit an ACF 160, as illustrated in FIG. 2B. A third chamber 330 may be employed to etch back the ACF 160 and to perform an etch of the barrier material overhang (e.g., barrier-material corner) 135 as illustrated in FIGS. 2A, 2B and 2C. As described above relative to respective steps 540 and 550 (FIG. 7) of the implementation, etches performed in the third chamber 330 following the mentioned prior processing by and within the cluster tool can have an effect of eliminating the barrier overhang 135 of the barrier material.

Figure 6:
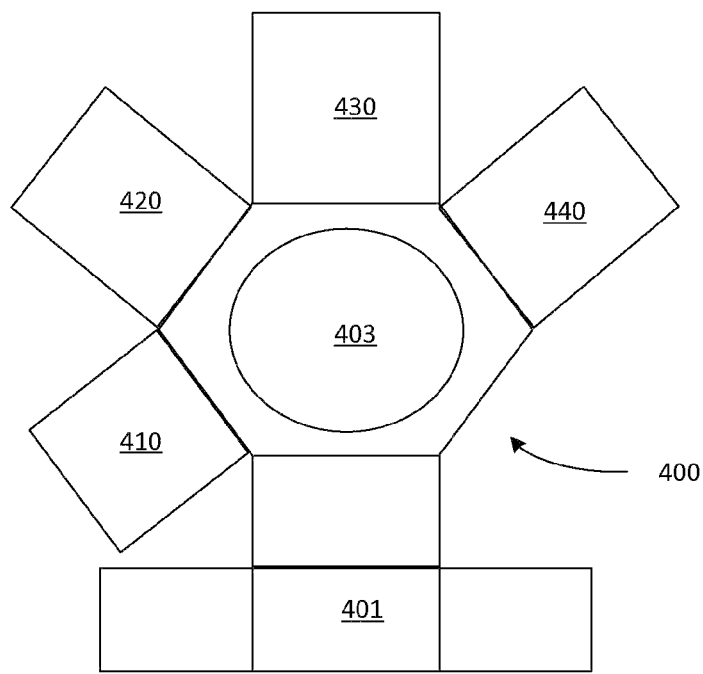
FIG. 6 illustrates an embodiment of another cluster tool that may implement further methods of the present invention.

An alternative embodiment of a cluster tool 400, according to the present invention, may comprise four chambers as illustrated in FIG. 6. This embodiment comprises load/lock chamber 401 and a transfer module 403 that may be similar or identical to the respective load/lock chamber 301 and transfer module 303 described above with reference to FIG. 5. The embodiment further comprises a first chamber 410 dedicated to a deposition process comprising RF PVD. A second chamber 420 implements a CVD process. Remaining chambers 430 and 440 may be similar or identical to respective chambers 320 and 330 described above with reference to FIG. 5.

Although the disclosure herein refers to certain illustrated embodiments, it is to be understood that these embodiments have been presented by way of example rather than limitation. For example, the invention may be applied to other processes at mid-end-of-line (MEOL) or front-end-of-line (FEOL) stages of wafer fabrication that can benefit from a CVD chamber, an ashable amorphous carbon gap-fill (e.g., coating) chamber and an amorphous carbon etchback and corner etch chamber. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A method for metal fill-in comprising:
providing a semiconductor structure that includes at least one undulation;
depositing a barrier material to cover at least part of the semiconductor structure including the at least one undulation and to form an overhang of the barrier material in the at least one undulation in a first chamber of a cluster tool;
depositing an ashable material film on the semiconductor structure including the at least one undulation and the overhang of the barrier material in the at least one undulation in a second chamber of the cluster tool;
etching back the ashable material film to expose the overhang of the barrier material and leave a reduced portion of the ashable material film to protect the entire bottom of the at least one undulation;
etching to remove the overhang of the barrier material in a third chamber of the cluster tool; and
stripping the reduced portion of the ashable material film, whereby subsequent metal fill-in of the at least one undulation of the semiconductor structure is facilitated with reduced incidence of defect as a consequence of the removal of the overhang of the barrier material.

2. The method as set forth in claim 1, further comprising filling-in the at least one undulation of the semiconductor structure with a metal without defect as a consequence of the removal of the overhang of the barrier material.

3. The method as set forth in claim 1, wherein the semiconductor structure comprises a plurality of undulations and the barrier material is deposited over a dielectric material.

4. The method as set forth in claim 1, wherein the barrier material comprises titanium nitride.

5. The method as set forth in claim 1, wherein the ashable material film comprises an amorphous carbon film.

6. The method as set forth in claim 1, wherein the etching back comprises a particle bombardment.

7. The method as set forth in claim 1, wherein the etching to remove the overhang of the barrier material comprises an anisotropic etch.

8. The method as set forth in claim 1, wherein the providing comprises providing a semiconductor structure that comprises a plurality of undulations.

9. The method as set forth in claim 8, wherein the barrier material is disposed to cover at least one of the undulations, and the ashable material film is deposited over at least one of the undulations.

10. The method as set forth in claim 9, wherein the undulations comprise contact holes.

11. The method as set forth in claim 1, in which the cluster tool has three chambers all collocated via a main platform.

12. The method as set forth in claim 11, in which the depositing a barrier material is performed in the first chamber connected to the main platform, the depositing an ashable material film is performed in the second chamber connected to the main platform, and the etching and etching back steps are performed in the third chamber connected to the main platform.

13. An integrated circuit fabricated according to the method set forth in claim 1.

14. A method for metal fill-in comprising:
providing a semiconductor structure;
etching to form a contact hole in the semiconductor structure;
depositing a barrier material within the contact hole to form a thin layer of the barrier material covering surfaces of the contact hole in a first chamber of a cluster tool, the depositing resulting in an overhang of the barrier material that partially occludes an opening of the contact hole;
coating over the contact hole with an ashable material film in a second chamber of the cluster tool;
etching back the ashable material film to expose the overhang of the barrier material and leave a reduced portion of the ashable material film to protect the entire bottom of the contact hole, and etching to remove the overhang of the barrier material in a third chamber of the cluster tool; and
stripping the reduced portion of the ashable material film, wherein removing the overhang of the barrier material as set forth herein facilitates conducting metal fill-in of the contact hole without defect.

15. The method of claim 14, which further comprises filling-in the contact hole with a conducting metal without defect.

16. The method of claim 14, wherein the barrier material comprises titanium nitride, the ashable material film comprises an amorphous carbon film, and the etching back comprises a particle bombardment.

17. The method of claim 14, wherein the etching to remove the overhang of the barrier material comprises an anisotropic etch.

18. The method of claim 14, wherein the etching to remove the overhang of the barrier material is performed using an etchant including $Cl_2$ or $BCl_2$.

19. The method of claim 14 wherein the first, second and third chambers of the cluster tool are each collocated with a single, shared main platform.

20. The method of claim 14 wherein the first chamber of the cluster tool comprises a radio-frequency physical vaporization chamber or a chemical vapor deposition chamber.

* * * * *